(12) United States Patent
Jeon

(10) Patent No.: US 7,229,878 B2
(45) Date of Patent: Jun. 12, 2007

(54) PHOTOTRANSISTOR OF CMOS IMAGE SENSOR AND METHOD FOR FABRICATING THE SAME

(75) Inventor: In Gyun Jeon, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/175,524

(22) Filed: Jul. 5, 2005

(65) Prior Publication Data

US 2006/0001121 A1 Jan. 5, 2006

(30) Foreign Application Priority Data

Jul. 5, 2004 (KR) .................. 10-2004-0052006

(51) Int. Cl.
*H01L 21/8242* (2006.01)
(52) U.S. Cl. .................. 438/246; 438/128; 438/586; 438/597; 438/598; 257/E21.551; 257/E21.585
(58) Field of Classification Search ................ 438/128, 438/586, 597, 598, 246; 256/E21.551, E21.585
See application file for complete search history.

(56) References Cited

U.S. PATENT DOCUMENTS

| | | | |
|---|---|---|---|
| 5,841,126 A | 11/1998 | Fossum et al. | |
| 5,886,659 A | 3/1999 | Pain et al. | |
| 5,990,506 A | 11/1999 | Fossum et al. | |
| 6,005,619 A | 12/1999 | Fossum | |
| 6,021,172 A | 2/2000 | Fossum et al. | |
| 6,261,908 B1 * | 7/2001 | Hause et al. | 438/280 |
| 6,261,920 B1 * | 7/2001 | Oyamatsu | 438/424 |
| 6,462,365 B1 | 10/2002 | He et al. | |
| 6,613,690 B1 * | 9/2003 | Chang et al. | 438/712 |
| 6,849,886 B1 | 2/2005 | Han | |
| 2001/0010938 A1 * | 8/2001 | Bronner et al. | 438/3 |
| 2002/0024092 A1 * | 2/2002 | Palm et al. | 257/330 |
| 2003/0020119 A1 * | 1/2003 | Arai et al. | 257/365 |
| 2005/0064620 A1 | 3/2005 | Han | |
| 2005/0064665 A1 | 3/2005 | Han | |
| 2005/0088556 A1 | 4/2005 | Han | |
| 2005/0093036 A1 | 5/2005 | Han | |
| 2005/0179093 A1 * | 8/2005 | Morris | 257/371 |
| 2006/0124982 A1 * | 6/2006 | Ho et al. | 257/304 |
| 2006/0249759 A1 * | 11/2006 | Morris | 257/286 |

* cited by examiner

*Primary Examiner*—Michelle Estrada
*Assistant Examiner*—Jarrett J. Stark
(74) *Attorney, Agent, or Firm*—Andrew D. Fortney

(57) ABSTRACT

A phototransistor of a CMOS image sensor suitable for decreasing the size of layout, and a method for fabricating the phototransistor are disclosed, in which the phototransistor includes a first conductive type semiconductor substrate; an STI layer on the first conductive type semiconductor substrate, to define an active area and a device isolation area in the first conductive type semiconductor substrate; a second conductive type well in the first conductive type semiconductor substrate; a gate line on the first conductive type semiconductor substrate; an ohmic contact layer in the second conductive type well, wherein the ohmic contact layer is overlapped with the gate line in state of interposing the STI layer therebetween; and a contact to connect the gate line with the ohmic contact layer through the STI layer.

16 Claims, 5 Drawing Sheets

PHOTOTRANSISTOR OF CMOS IMAGE SENSOR AND METHOD FOR FABRICATING THE SAME

CROSS-REFERENCE TO RELATED APPLICATIONS

This application claims the benefit of Korean Application No. P2004-52006 filed on Jul. 5, 2004, which is hereby incorporated by reference as if fully set forth herein.

BACKGROUND OF THE INVENTION

1. Field of the Invention

The present invention relates to a CMOS image sensor, and more particularly, to a phototransistor of a CMOS image sensor suitable for decreasing the size of layout, and a method for fabricating the phototransistor.

2. Discussion of the Related Art

Generally, an image sensor is a semiconductor device for converting an optical image into an electric signal. The image sensor can be broadly categorized into a charge coupled device (CCD) and a complementary metal oxide semiconductor (CMOS) image sensor.

In case of the CCD, respective metal-oxide-silicon MOS capacitors are positioned adjacently, wherein electric charge carriers are stored in and transferred to the capacitors. Meanwhile, the CMOS image sensor adopts the CMOS technology of using a control circuit and a signal processing circuit as the circumferential circuit. The CMOS image sensor uses the switching method of sequentially detecting output signals by forming the predetermined number of MOS transistors in correspondence with the number of pixels.

The CCD has the high power consumption and the complicated mask process. Also, it is impossible to provide the signal processing circuit inside the CCD chip, whereby it cannot be formed in one chip. In order to overcome these problems, the sub-micron CMOS fabrication technology has been researched and developed.

In the CMOS image sensor, the photo-sensing means is generally formed of a photodiode. Recently, instead of the photodiode, a phototransistor is used for the photo-sensing means, to improve the photo-sensing degree.

FIG. 1 is a circuit diagram of showing a unit pixel in a 3-T CMOS image sensor according to the related art.

As shown in FIG. 1, a unit pixel of a 3-T CMOS image sensor according to the related art is comprised of a phototransistor PT, and three NMOS transistors Rx, Dx and Sx.

The phototransistor PT is formed as a PMOS transistor structure in which a gate is connected with a semiconductor substrate. Accordingly, when the light is incident on the phototransistor PT, electrons are accumulated on the semiconductor substrate, whereby a gate potential is lowered. Due to the lowered gate potential, holes are accumulated to the lower side of gate. In proportion to the amount of accumulated holes, more electrons are accumulated to the semiconductor substrate. Thus, the gate potential becomes lower. As a result, the phototransistor PT functions as the photo-sensing means having the great photo-photosensitivity according to the repetitive mechanism. That is, the phototransistor PT is very sensitive to the small amount of light.

Among the three NMOS transistors, the reset transistor Rx discharges the electrons stored in a floating sensing node FSN to detect the signal. The drive transistor Dx changes an output voltage of a unit pixel by changing a current of a source follower according to the change on the potential of the floating sensing node FSN. The select transistor Sx is provided for switching and addressing.

In addition, a DC gate is a load transistor, which has a gate having a constant voltage applied thereto. That is, since the constant voltage is applied to the gate of the transistor, a constant current flows through the DC gate. Also, 'VDD' is a drive power voltage, 'GND' is a ground voltage, and 'Signal Out' is an output voltage of a unit pixel.

Hereinafter, a phototransistor of a CMOS image sensor according to the related art will be described with reference to the accompanying drawings.

FIG. 2 is a layout of a phototransistor according to the related art. FIG. 3 is a cross sectional view along A—A' of FIG. 2.

As shown in FIG. 2 and FIG. 3, an N-well 12 is formed in a p-type semiconductor substrate 11, and an STI layer 13 is formed in a device isolation area of the p-type semiconductor substrate 11, whereby the semiconductor substrate 11 is divided into an active area and the device isolation area.

After that, a gate line 14 is formed by forming a gate oxide layer 21 on the active area of the semiconductor substrate 11. Then, source and drain 15 and 16 are formed at both sides of the gate line 14 in the active area of the semiconductor substrate 11, wherein the source and drain 15 and 16 are formed in the p-type. Also, an ohmic contact layer 17 is formed in the active area of the semiconductor substrate 11, wherein the ohmic contact layer 17 is formed at the predetermined interval from the gate line 14.

Then, contacts 18 and 19 are respectively formed on the gate line 14 and the ohmic contact layer 17, wherein the contacts 18 and 19 pass through an insulating interlayer (not shown). Herein, the contacts 18 and 19 are connected with each other by an upper metal layer 20. That is, the gate line 14 is connected with the N-well 12 through the contact 18, the metal layer 20, the contact 19 and the ohmic contact layer 17.

If applying a reverse bias to the N-well 12, the N-well 12 becomes a depletion layer. When the light is incident on the depletion layer, electron-hole pairs are generated. In this state, the holes are discharged to the semiconductor substrate 11, and the electrons are accumulated to the depletion layer.

As the electrons are accumulated to the depletion layer, the potential of the ohmic contact layer 17 is lowered, whereby the potential of the gate line 14 connected with the ohmic contact layer 17 is also lowered. Accordingly, the holes are accumulated to the lower side of the gate line 14. In proportion to the amount of accumulated holes, more electrons are accumulated to the depletion layer.

Accordingly, the potential of the ohmic contact layer 17 is lowered, and the potential of the gate line 14 is also lowered. Thus, more holes are accumulated to the lower side of the gate line 14. In proportion to the amount of accumulated holes, more electrons are accumulated to the depletion layer.

According to the repetitive mechanism, the phototransistor is very sensitive to the small amount of light. That is, the phototransistor serves as the photo-sensing means of the great photo-sensitivity.

However, the related art phototransistor has the following disadvantages.

In the related art phototransistor, the gate line 14 is formed at the predetermined interval from the ohmic contact layer 17. Accordingly, it is necessary to provide the additional area for design of the ohmic contact layer 17. That is, the entire layout area increases, and the chip size also increases.

SUMMARY OF THE INVENTION

Accordingly, the present invention is directed to a phototransistor of a CMOS image sensor and a method for fabricating the same that substantially obviates one or more problems due to limitations and disadvantages of the related art.

An object of the present invention is to provide a phototransistor of a CMOS image sensor suitable for decreasing the size of layout, and a method for fabricating the phototransistor.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a phototransistor of a CMOS image sensor includes a first conductive type semiconductor substrate; an STI layer on the first conductive type semiconductor substrate, to define an active area and a device isolation area in the first conductive type semiconductor substrate; a second conductive type well in the first conductive type semiconductor substrate; a gate line on the first conductive type semiconductor substrate; an ohmic contact layer in the second conductive type well, wherein the ohmic contact layer is overlapped with the gate line in state of interposing the STI layer therebetween; and a contact to connect the gate line with the ohmic contact layer through the STI layer.

In another aspect, a method for fabricating a phototransistor of a CMOS image sensor includes the steps of defining an active area and a device isolation area in a first conductive type semiconductor substrate by forming an STI layer in the first conductive type semiconductor substrate; forming a second conductive type well in the first conductive type semiconductor substrate; forming a gate oxide layer on an entire surface of the first conductive type semiconductor substrate; forming a contact hole for exposing the predetermined portion of the second conductive type well below the STI layer by selectively removing the gate oxide layer and the STI layer; forming an ohmic contact layer in the second conductive well below the contact hole; forming a contact by filling the contact hole with a conductive material; and forming a gate line on the first conductive type semiconductor substrate including the contact.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a phototransistor of a CMOS image sensor according to the present invention will be described with reference to the accompanying drawings.

Figure 1:
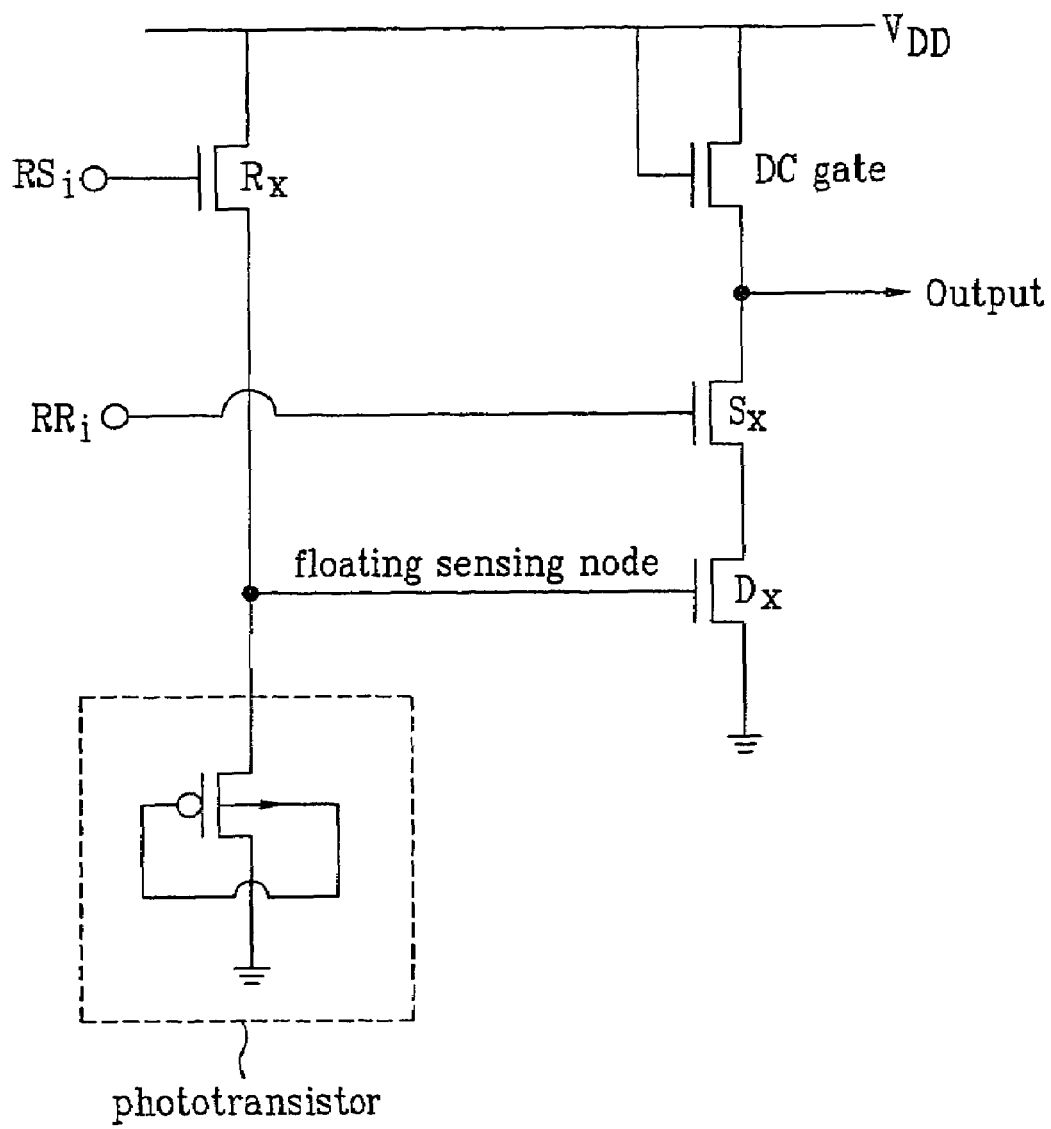
FIG. 1 is a circuit diagram of showing a unit pixel in a 3-T CMOS image sensor according to the related art.
Figure 2:
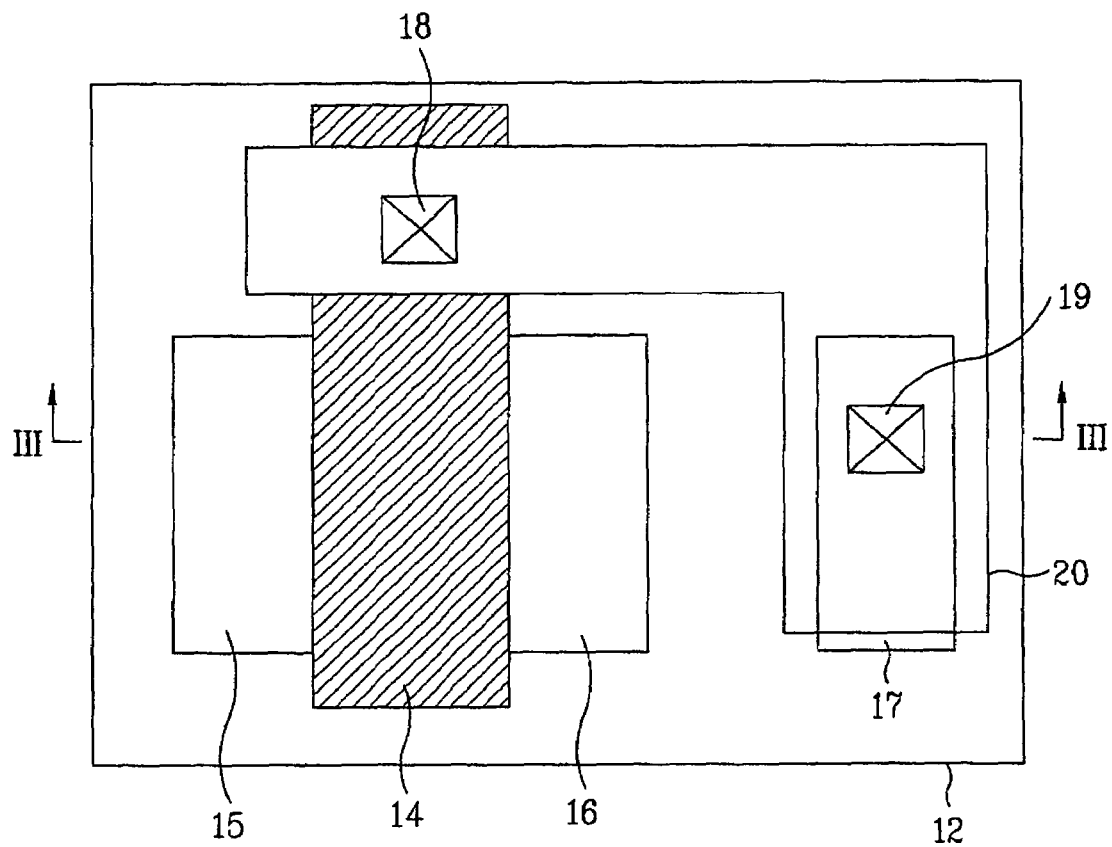
FIG. 2 is a layout of a phototransistor according to the related art.
Figure 3:
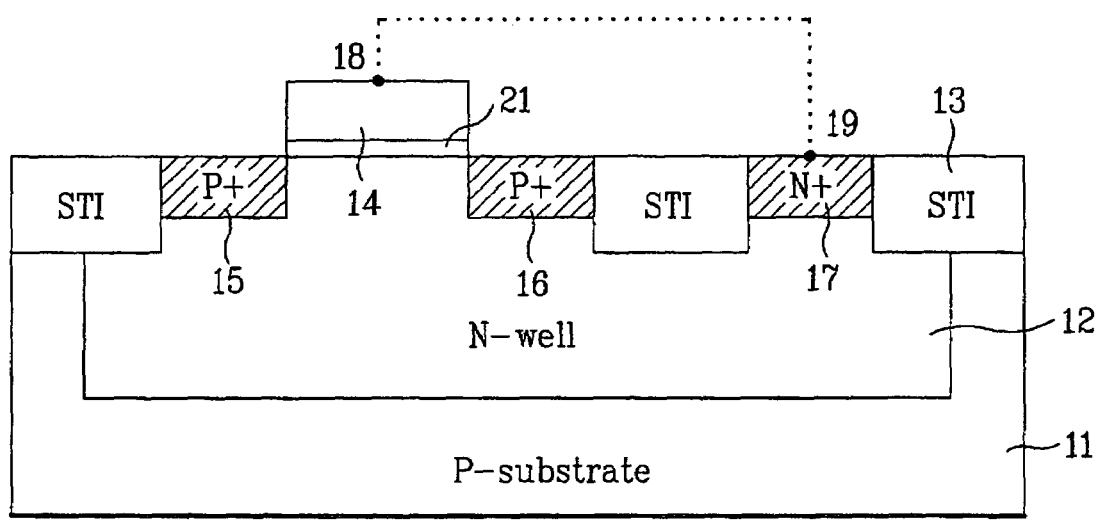
FIG. 3 is a cross sectional view along A–A' of FIG. 2.
Figure 4:
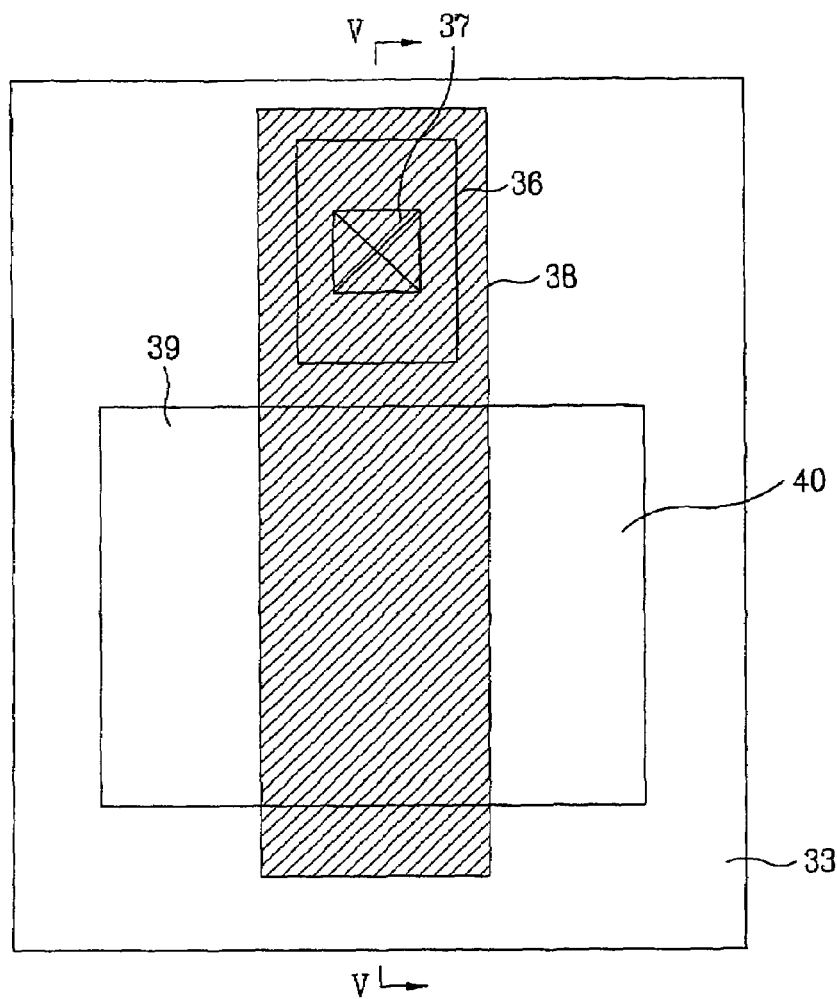
FIG. 4 is a layout of a phototransistor in a CMOS image sensor according to the present invention.
Figure 5:
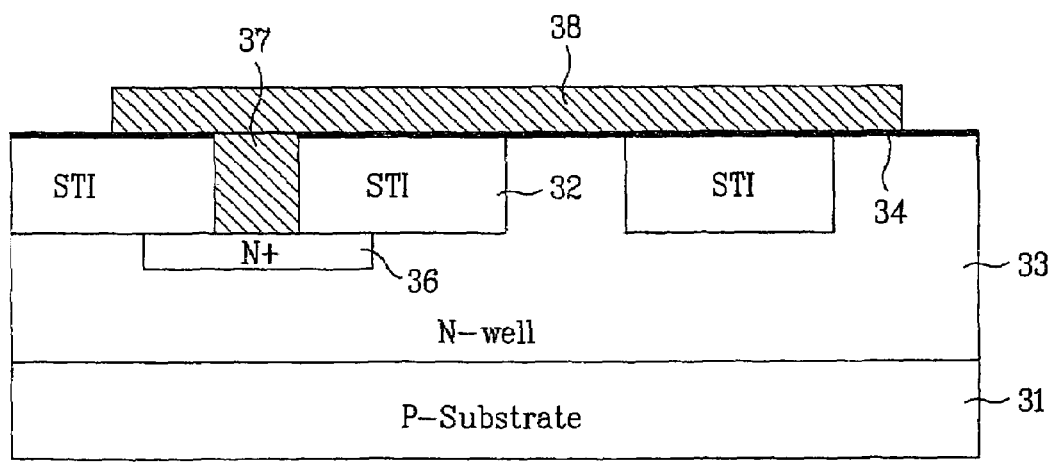
FIG. 5 is a cross sectional view along B–B' of FIG. 4.

FIG. 4 is a layout of a phototransistor in a CMOS image sensor according to the present invention. FIG. 5 is a cross sectional view along B–B' of FIG. 4.

In a phototransistor of a CMOS image sensor according to the present invention, as shown in FIG. 4 and FIG. 5, an STI layer 32 is formed in a device isolation area of a p-type semiconductor substrate 31. As a result, the p-type semiconductor substrate 31 is divided into an active area and the device isolation area. Also, an N-well 33 is formed in the semiconductor substrate 31, wherein the N-well 33 has the predetermined depth.

Also, a gate oxide layer 34 is formed on the predetermined portion of the semiconductor substrate 31, thereby forming a gate line 38. Then, source and drain 39 and 40 are formed at both sides of the gate line 38 in the active area of the semiconductor substrate 31, wherein the source and drain 39 and 40 are doped with p-type.

In addition, an ohmic contact layer 36 is formed in the N-well 33 below the STI layer 32 overlapped with the gate line 38. The ohmic contact layer 36 is electrically connected with the gate line 38 by a contact 37 through the STI layer 32.

In the phototransistor of the CMOS image sensor according to the present invention, the ohmic contact layer 36 is partially overlapped with the gate line 38, whereby it doesn't requires the additional area for design of the ohmic contact layer 36.

A method for fabricating the phototransistor according to the present invention will be described with reference to the accompanying drawings.

Figure 6A:
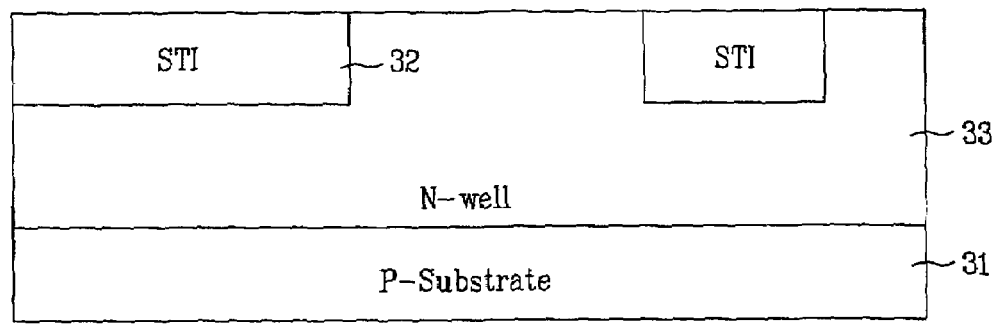
FIG. 6A to FIG. 6C are cross sectional views of the process for fabricating a phototransistor according to the present invention.
Figure 6B:
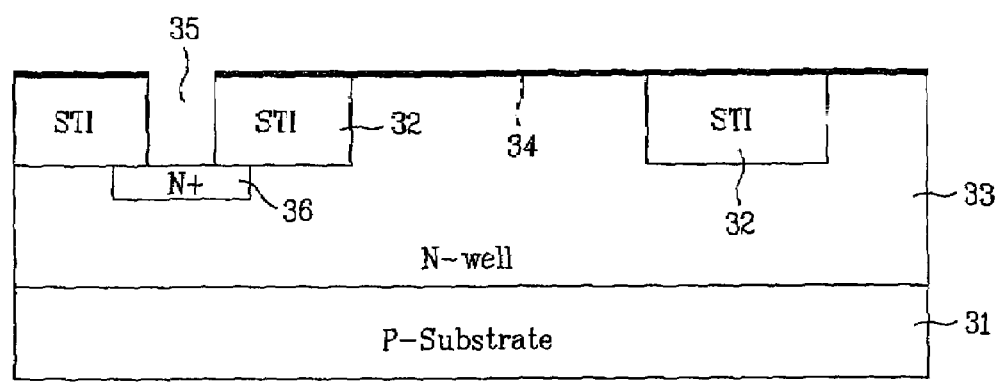
Figure 6C:
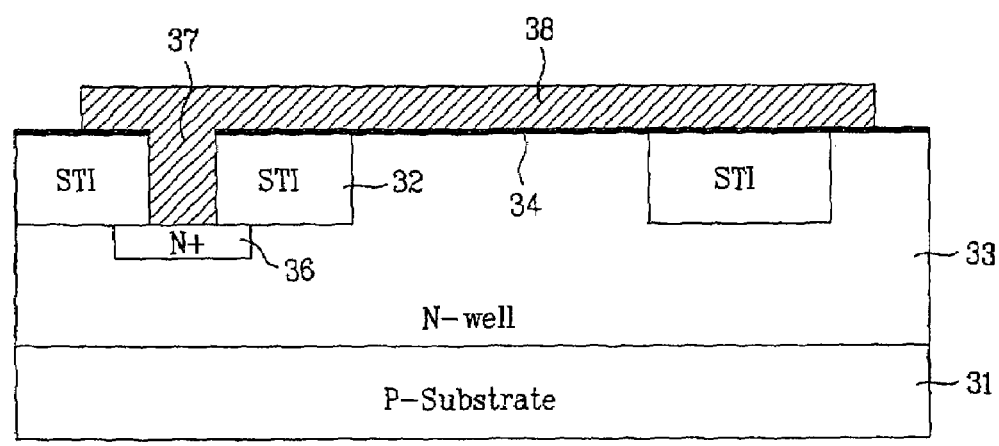

FIG. 6A to FIG. 6C are cross sectional views of the process for fabricating the phototransistor according to the present invention.

First, as shown in FIG. 6A, the STI layer 32 is formed in the p-type semiconductor substrate 31, thereby dividing the semiconductor substrate 31 into the active area and the device isolation area. Then, the N-well 33 having the constant depth is formed in the semiconductor substrate 31 by implantation and diffusion of N-type impurity ions.

Referring to FIG. 6B, the gate oxide layer 34 is formed on the entire surface of the semiconductor substrate 31 including the STI layer 32. Then, the gate oxide layer 34 and the STI layer 32 are partially removed to expose the N-well 33 below the predetermined portion of the STI layer 32, thereby forming a contact hole 35.

Subsequently, N-type impurity ions are implanted to the semiconductor substrate 31 in state of using the gate oxide layer 34 as a mask, thereby forming the ohmic contact layer 36 in the N-well 33 below the contact hole 35.

Then, a polysilicon layer is coated on the entire surface of the semiconductor substrate 31 including the contact hole 35, and is then selectively patterned to remain on the predetermined portion including the contact hole 35, thereby forming the contact 37 inside the contact hole 35. Then, the gate line 38 is formed on the gate oxide layer 34.

Herein, the contact 37 and the gate line 38 are formed at the same time. However, it is possible to form the gate line 38 on the predetermined portion including the contact 37 after forming the contact 37 by filling the contact hole 35 with a conductive material.

Although not shown, p-type impurity ions are implanted to the active area of the semiconductor substrate 31 in state of using the gate line 38 as a mask, thereby forming the source and drain 39 and 40. According to the aforementioned process, it is possible to complete the phototransistor of the CMOS image sensor according to the present invention.

As mentioned above, the phototransistor of the CMOS image sensor according to the present invention has the following advantages.

In the phototransistor of the CMOS image sensor according to the present invention, the ohmic contact layer is formed below the gate line. Accordingly, there is no requirement for providing the additional area for design of the ohmic contact layer, so that it is possible to decrease the size of layout.

Also, the phototransistor of the CMOS image sensor according to the present invention doesn't requires a metal line for connecting the ohmic contact layer with the gate line, thereby obtaining the simplified fabrication process.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a phototransistor of a CMOS image sensor comprising:
    defining an active area and a device isolation area in a first conductive type semiconductor substrate by forming an STI layer in the first conductive type semiconductor substrate;
    forming a second conductive type well in the first conductive type semiconductor substrate, wherein the first conductive type is different from the second conductive type;
    forming a gate oxide layer on art entire surface of the first conductive type semiconductor substrate;
    forming a contact hole for exposing the predetermined portion of the second conductive type well below the STI layer by selectively removing the gate oxide layer and the STI layer;
    forming an ohmic contact layer by implanting second conductive type impurity ions into the second conductive type well below the contact hole using the gate oxide layer as a mask;
    forming a contact by filling the contact hole with a conductive material; and
    forming a gate line over the first conductive type semiconductor substrate including the contact.

2. The method of claim 1, further comprising forming source and drain at opposite sides of the gate line in the second conductive type well by implanting highly doped first conductive type impurity ions to the first conductive type semiconductor substrate using the gate line as a mask.

3. The method of claim 1, wherein a polysilicon is formed over the entire surface of the first conductive type semiconductor substrate including the contact hole, and is then patterned to remain on predetermined portions for the contact and the gate line, so as to form the contact and the gate line at the same time.

4. The method of claim 1, wherein implanting second conductive type impurity ions comprises implanting impurity ions at a high concentration.

5. The method of claim 1, wherein the gate line is formed ohmic contact layer.

6. The method of claim 1, wherein the ohmic contact layer directly contacts wit the contact.

7. The method of claim 1, wherein the ohmic contact layer electrically connects with the gate line.

8. The method of claim 1, wherein the second conductive type well has a uniform depth.

9. The method of claim 1, wherein forming a second conductive type well comprises implanting impurity ions.

10. The method of claim 9, wherein forming a second conductive type well comprises diffusing the implanted impurity ions.

11. The method of claim 1, wherein forming a second conductive type well comprises implanting N-type impurity ions.

12. The method of claim 1, wherein implanting second conductive type impurity ions comprises implanting N-type impurity ions.

13. The method of claim 1, wherein the gate oxide layer remains over a top surface of the STI layer following forming the contact hole.

14. The method of claim 1, wherein a portion of the ohmic contact layer is formed below the STI layer.

15. The method of claim 14, wherein the ohmic contact layer overlaps with the gate line.

16. The method of claim 14, wherein the gate line is formed on the gate oxide layer.

* * * * *